(12) United States Patent
Chen et al.

(10) Patent No.: US 7,180,743 B2
(45) Date of Patent: Feb. 20, 2007

(54) FASTENER FOR HEAT SINK

(75) Inventors: Chun-Chi Chen, Tu-Cheng (TW); Shi-Wen Zhou, Shenzhen (CN); Hsieh-Kun Lee, Tu-Cheng (TW)

(73) Assignees: Fu Zhun Precision Industry (Shenzhen) Co., Ltd. (CN); Hon Hai Precision Industry Co., Ltd. (TW)

( * ) Notice: Subject to any disclaimer, the term of this patent is extended or adjusted under 35 U.S.C. 154(b) by 319 days.

(21) Appl. No.: 10/989,694

(22) Filed: Nov. 16, 2004

(65) Prior Publication Data

US 2005/0141201 A1 Jun. 30, 2005

(30) Foreign Application Priority Data

Dec. 26, 2003 (TW) .............................. 92222757 U

(51) Int. Cl.
*H05K 7/20* (2006.01)

(52) U.S. Cl. ............... 361/704; 361/709; 361/710; 361/719; 257/718; 257/719; 257/727; 165/80.3; 165/185; 411/41; 411/45

(58) Field of Classification Search ........... 361/704, 361/709, 710, 719, 712–717, 720, 736, 752; 257/706–727; 174/16.3, 252; 165/80.3, 165/185, 453, 457, 458; 24/297, 508, 457–458, 24/453; 411/508, 509, 510, 511, 518, 41, 411/45, 521, 297, 913; 248/510, 511
See application file for complete search history.

(56) References Cited

U.S. PATENT DOCUMENTS

| 6,392,889 | B1 * | 5/2002 | Lee et al. | 361/704 |
|---|---|---|---|---|
| 6,412,546 | B1 * | 7/2002 | Lin et al. | 165/80.3 |
| 6,480,387 | B1 * | 11/2002 | Lee et al. | 361/704 |
| 6,514,023 | B2 * | 2/2003 | Moerke | 411/45 |
| 6,667,882 | B2 * | 12/2003 | Pauser | 361/695 |
| 6,667,884 | B1 * | 12/2003 | Lee et al. | 361/697 |
| 6,795,317 | B1 * | 9/2004 | Liu | 361/704 |
| 6,826,054 | B2 * | 11/2004 | Liu | 361/719 |
| 6,829,143 | B2 * | 12/2004 | Russell et al. | 361/704 |
| 6,866,540 | B2 * | 3/2005 | Robertson | 439/488 |
| 6,934,155 | B2 * | 8/2005 | Aoki et al. | 361/704 |
| 7,116,556 | B2 * | 10/2006 | Lee et al. | 361/704 |

FOREIGN PATENT DOCUMENTS

| TW | 410992 | 11/2000 |
|---|---|---|
| TW | 454899 | 9/2001 |
| TW | 461696 | 10/2001 |
| TW | 465805 | 11/2001 |
| TW | 468814 | 12/2001 |

* cited by examiner

*Primary Examiner*—Michael Datskovskiy
(74) *Attorney, Agent, or Firm*—Morris Manning & Martin LLP; Tim Tingkang Xia, Esq.

(57) ABSTRACT

A fastener for a heat sink of the present invention includes a length-variable operating member (10), a piston member (20), an embracing member (30), a resilient member (40) and a post (58) extending from a printed circuit board (50). The piston member is movable in the operating member when the operating member varies between a shortest length and a longest length. The resilient member covers around the piston member. The embracing member is controllable cooperatively by the piston member and the resilient member to grasp the post or release the post.

19 Claims, 3 Drawing Sheets

FASTENER FOR HEAT SINK

BACKGROUND OF THE INVENTION

1. Field of the Invention

The present invention relates to fasteners, and more particularly to a fastener for securing a heat sink to an electronic component.

2. Description of Prior Art

Numerous modern electronic components such as central processing units (CPUs) of computers generate large amounts of heat during operation. The heat must be efficiently removed from the CPU; otherwise, abnormal operation or damage may result. Typically, a heat dissipation device such as a heat sink is mounted on the CPU to remove heat therefrom.

Mostly, holes are defined in printed circuit boards (PCBs). Screws are inserted through the heat sink and engaged within the holes of the PCB to mount the heat sink on the CPU. However, attachment and detachment of the screws are unduly laborious. Furthermore, the PCB is prone to be deformed due to overloaded force on partial portions thereof.

For overcoming the above-mentioned problems, metal piece clips are developed. This kind of clip commonly has a M-shaped profile. The clip comprises a central pressing portion and a pair of engaging portions extending perpendicularly from the pressing portion. The pressing portion is for pressing the heat sink toward the CPU. The engaging portions are for engaging with a socket or a retention module in order to secure the heat sink and to render the heat sink in contact with the CPU. Unfortunately, tools are required to have the engaging portions engaged with the socket or the retention module. Engagement and disengagement of the clip with and from the socket or the retention module are still unduly laborious.

SUMMARY OF THE INVENTION

Accordingly, an object of the present invention is to provide a fastener for a heat sink which is convenient to attach the heat sink to an electronic component.

In order to achieve the object set out above, a fastener for a heat sink in accordance with a preferred embodiment of the present invention comprises a length-variable operating member, a piston member, an embracing member, a resilient member and a post extending from a printed circuit board. The piston member is movable in the operating member when the operating member varies between a shortest length and a longest length. The resilient member covers around the piston member. The embracing member is controllable, cooperatively by the piston member and the resilient member, to grasp the post or release the post.

Other objects, advantages and novel features of the present invention will become more apparent from the following detailed description when taken in conjunction with the accompanying drawings, in which:

DETAILED DESCRIPTION OF THE INVENTION

Figure 1:
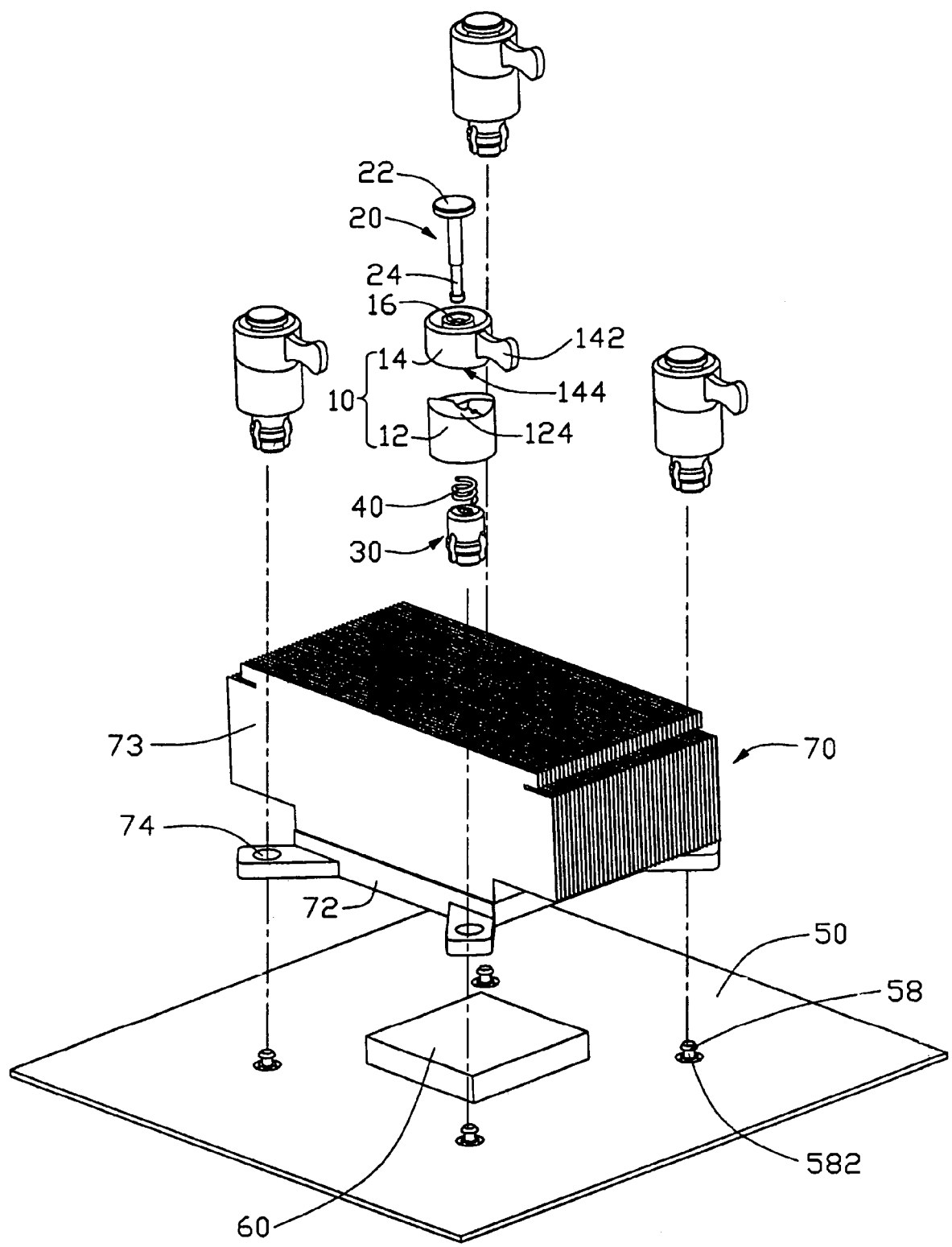
FIG. 1 is an exploded, isometric view of fasteners in accordance with a preferred embodiment of the present invention, a heat sink, and an electronic component mounted on a PCB.

Referring to FIGS. 1–5, four fasteners in accordance with the preferred embodiment of the present invention are for attaching a heat sink 70 to an electronic component 60 mounted on a PCB 50.

The PCB 50 defines four through holes (not labeled) therein spaced from and symmetrically around the electronic component 60. The posts 58 are formed from an enhancing plate (not labeled) underlying the PCB 50, and pass through the PCB 50 via the through holes (not labeled). Certainly, it is viable that the posts 58 are directly formed from the PCB 50. Each of the posts 58 defines an annular groove 582. The heat sink 70 has a flat base 72 defining four openings 74 therein, and a plurality of fins 73 for dissipating heat. The openings 74 are aligned with the posts 58 protruding from the PCB 50.

Each fastener comprises an operating member 10, a piston member 20, an embracing member 30 capable of clasping posts 58 protruding from the PCB 50, and a resilient member 40.

The operating member 10 of the fastener has a cylindraceous shape, and comprises a static part 12 resting on the base 72 of the heat sink and an active part 14 above the static part 12. The static part 12 has a curved joint surface 124. The active part 14 has a curved joint surface 144. The joint surfaces 124, 144 respectively have a lowest diameter line (not labeled) and a topmost diameter line (not labeled). The curved joint surfaces 124, 144 are inosculated (see FIG. 2), that is to say, the lowest diameter line of the active part 14 overlays the lowest diameter line of the static part 12. The topmost diameter line of the active part 14 overlays the topmost diameter line of the static part 12. At this stage, the operating member 10 has a shortest length. The operating member 10 defines a piston hole 16 and a room 18 coaxial with the piston hole 16. The room 18 is completely arranged in the static part 12. A handle 142 integrally extends from the active part 14. Via operation on the handle 142, the active part 14 is rotatable to slide on the joint surface 124 so that the lowest diameter line of the active part 14 rests on the topmost diameter line of the static part 12 (see FIG. 4). On the point, the operating member 10 has a longest length.

Figure 3:
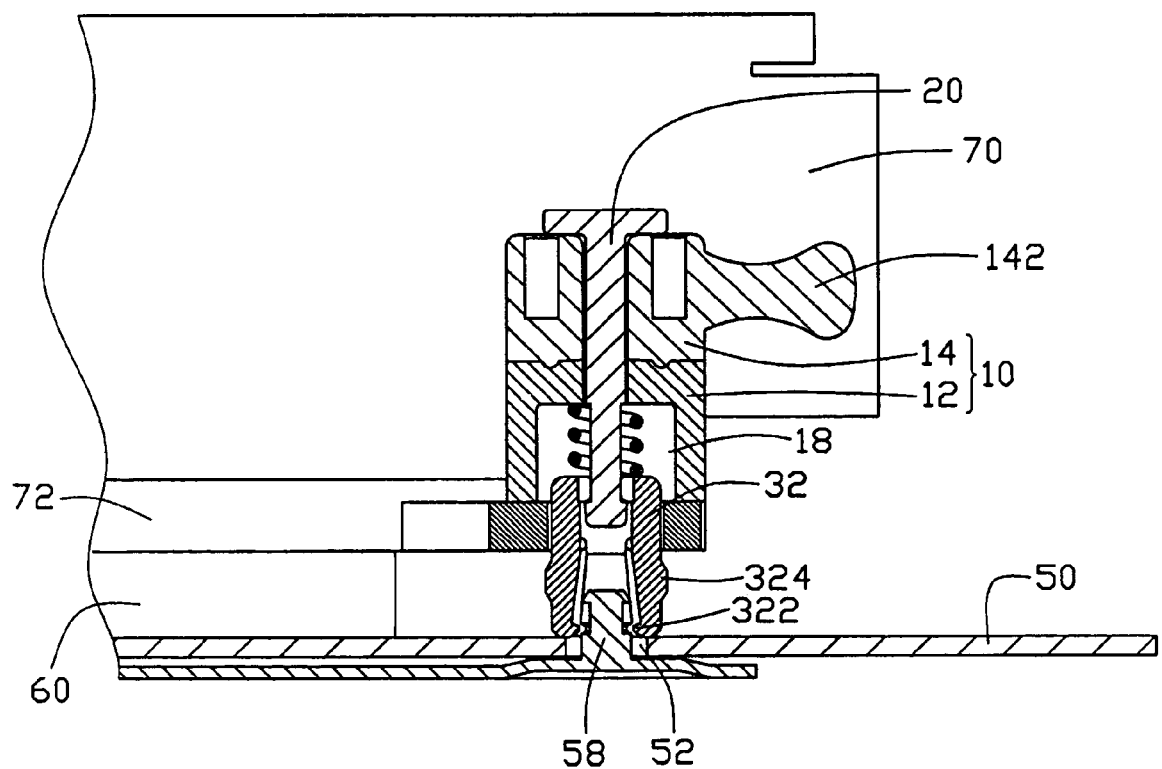
FIG. 3 is a cross-sectional view of FIG. 2, taken along line III—III.

The piston member 20 is extendable through the piston hole 16 of the operating member 10 and is further extendable through the room 18 of the operating member 10 (see FIG. 3). The piston member 20 comprises a head 22 integrally formed at an end of the piston member 20, and defines an annular notch 24 adjacent an opposite end of the piston member 20. The head 22 rests on the active part 14. The resilient member 40, such as a spring, covers around the piston member 20 in the annular notch 24.

The embracing member 30 is secured to an end of the piston member 20 opposing the head 22. The resilient member 40 is disposed in room 18 and between the static part 12 and the embracing member 30 (see FIG. 3). The embracing member 30 is movable up and down in a corresponding opening 74 of the heat sink 70. The embracing member 30 comprises three spaced embracing arms 32 for embracing a corresponding post protruded from the PCB 50. Each embracing arm 32 forms an inward hook 322 at a distal free end which is distant from the piston member 20. An outer protrusion 324 is formed at a middle of each embracing arm 32.

In use of the fastener as above-described, the static part 12 of the operating member 10 rests on the base 72 of the heat sink 70. The embracing member 30 is positioned into a corresponding opening 74 of the heat sink 70 from bottom of the heat sink 70. Referring to FIG. 3, the operating member 10 is in a state that the curved joint surfaces 124, 144 are inosculated, so that the operating member 10 has the shortest length. The resilient member 40 is in a natural state or in a slight compressed state. The protrusions 324 on the embracing member 30 are disposed between the heat sink 70 and the PCB 50. The embracing arms 32 are relaxed, and loosely surround a corresponding post 58 protruded from the PCB 50.

Figure 4:
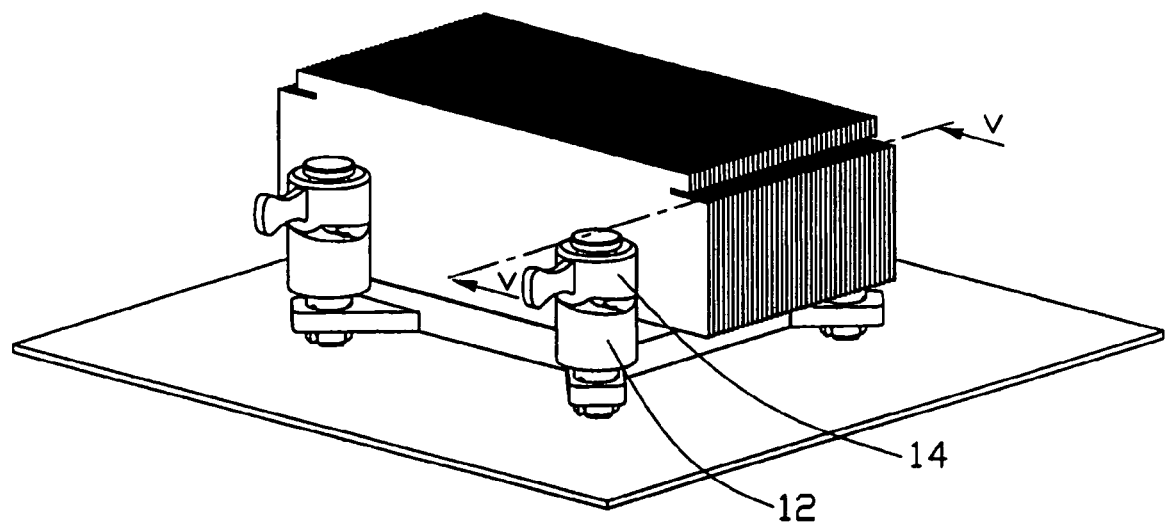
FIG. 4 is an assembled view of FIG. 1.
Figure 5:
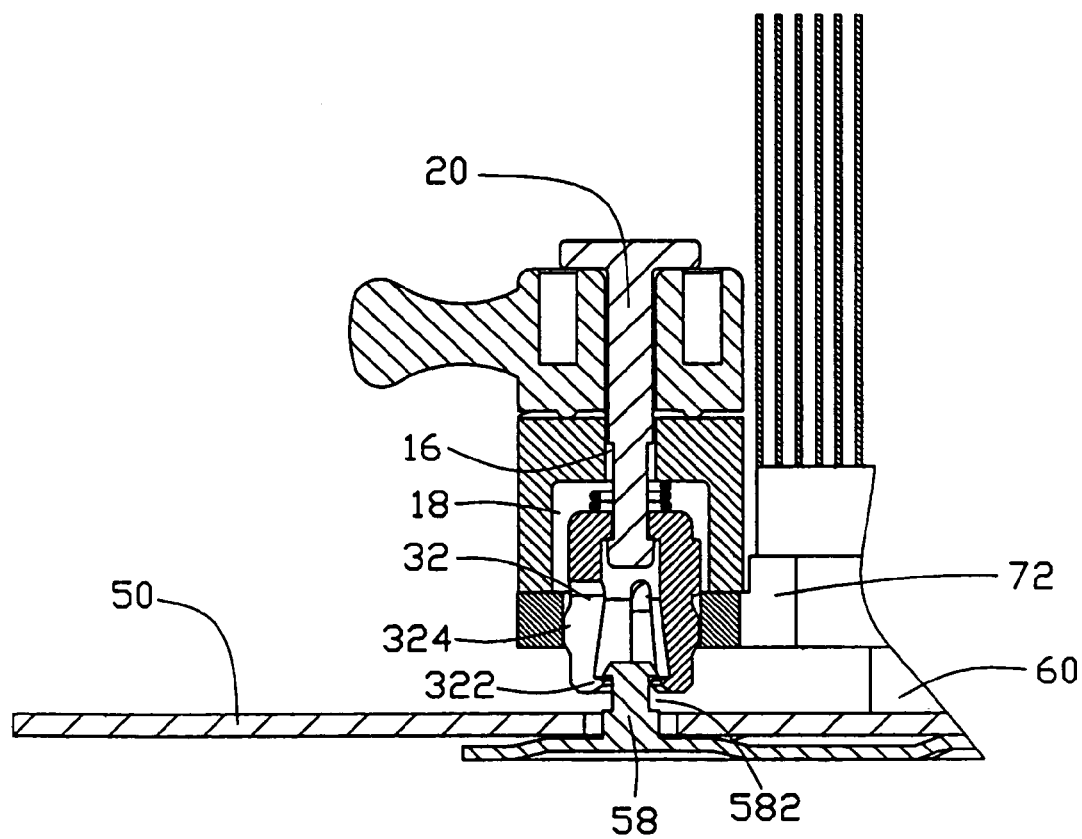
FIG. 5 is a cross-sectional view of FIG. 4, taken along line V—V.

Rotating the handle 142, the active part 14 slides on the joint surface 124 of the static part 12, until the lowest diameter line of the active part 14 rests on the topmost diameter line of the static part 12. The operating member 10 has the longest length as shown in FIGS. 4–5. The movement of the active part 14 causes the piston member 20 to be lift. The piston member 20 drags the embracing member 30 upwardly. The embracing member 30 thus moves away from the PCB 50, enters deep into the room 18 and compresses the resilient member 40 toward the static part 12. Simultaneously, the outer protrusions 324 enter the corresponding opening 74 of the heat sink 70. The embracing arms 32 are inwardly forced at the protrusions 324 by the base 72 of the heat sink 70, and are deformed to employ the hooks 322 to grasp the corresponding post 58 at the annular groove 582.

In the present invention, the operating member 10 and the embracing member 30 are positioned between opposite ends of the piston member 20. The resilient member 40 is disposed between the operating member 10 and the embracing member 30. Furthermore, the static part 12 of the operating member 10 rests on the base 72 of the heat sink 70, and cannot move in a direction toward the heat sink 70. Accordingly, once the active part 14 of the operating member 10 is moved to lengthen the operating member 10, the active part 14 of the operating member 10 can do nothing but move to be further away from the heat sink 70 than it is in original location. The piston member 20 moves along with the movement of the active part 14 of the operating member 10. Therefore, the embracing member 30 goes deep into the room 18 of the static part 12 and compresses the resilient member 40 toward the static part 12. The hooks 322 of the embracing member 30 grasp the corresponding post 58 at the annular groove 582. The compressed resilient member 40 exerts resilient force on the operating member 10 and the embracing member 30 toward opposite ends of the piston member 20. Simultaneously, the piston member 20 exerts contrarious forces on the operating member 10 and the embracing member 30.

Figure 2:
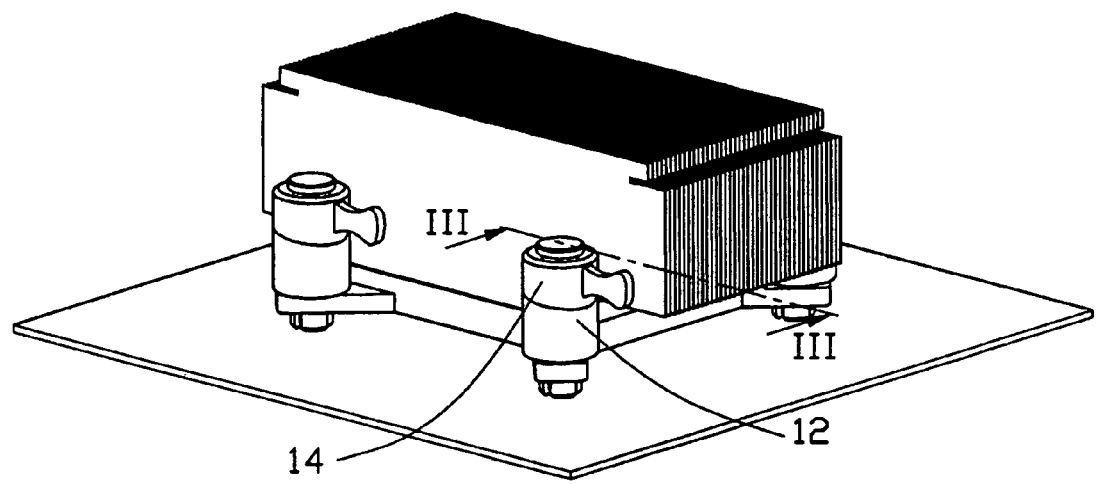
FIG. 2 is a pre-assembled view of FIG. 1.

To remove the heat sink 70 from the PCB 50, the handle 142 is rotated. The operating member 10 goes back to its original state to have the shortest length as shown in FIGS. 2–3. The resilient member 40 is thus released to push the piston member 20 and the embracing member 30 toward the PCB 50. The protrusions 324 slide out of the opening 74 of the heat sink 70 and are disposed between the heat sink 70 and the PCB 50. The embracing arms 32 stretch outwardly to their original state and release the post 58 from the hooks 322.

It is feasible in the present invention that the piston member 20 is integrally formed from the active part 14 of the operating member 10, so far as the piston member 20 can move with the movement of the active part 14. It is also feasible in the present invention that the static part 12 and the active part 14 of the operating member 10 are interacted by means of whorl without curved joint surfaces 124, 144, so far as the active part 14 can move upward and downward relative to the static part 12.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastener for a heat sink comprising:
a length-variable operating member;
a piston member movable in the operating member when the operating member varies between a shortest length and a longest length;
a resilient member covering around the piston member;
a post disposed about the heat sink; and
an embracing member being controllable cooperatively by the piston member and the resilient member to grasp the post or release the post.

2. The fastener for a heat sink of claim 1, wherein the operating member comprises a static part and an active part above the static part.

3. The fastener for a heat sink of claim 2, wherein a handle integrally extends from the active part, for facilitating operation of the active part.

4. The fastener for a heat sink of claim 2, wherein the active part is movable on the static part to make the operating member length-variable.

5. The fastener for a heat sink of claim 4, wherein the piston member is movable, along with the movement of the active part.

6. The fastener for a heat sink of claim 1, wherein the operating member defines a piston hole and a room coaxial with the piston hole.

7. The fastener for a heat sink of claim 6, wherein the piston member is received in the piston hole and the room.

8. The fastener for a heat sink of claim 6, wherein the piston member has a head at an end thereof resting on the active part, and defines a notch adjacent an opposite end thereof to receive the resilient member therein.

9. The fastener for a heat sink of claim 6, wherein the resilient member is disposed in the room, and is compressible by the embracing member toward the operating member.

10. The fastener for a heat sink of claim 1, wherein the embracing member comprises a plurality of embracing arms for embracing the post.

11. The fastener for a heat sink of claim 10, wherein the embracing arms each form an inward hook at a distal end thereof, and the post defines a groove therein, the hooks of the embracing arms grasping the post at the groove.

12. The fastener for a heat sink of claim 10, wherein the embracing arms each form an outer protrusion at a middle portion thereof.

13. The fastener for a heat sink of claim 1, wherein the resilient member is a spring.

14. An assembly, comprising:
a printed circuit board having a plurality of posts protruding therefrom;

an electronic component mounted on the printed circuit board and surrounded by the posts;

a plurality of fasteners; and a heat sink positioned to the electronic component via the fasteners;

wherein each of the fasteners comprises an operating member resting on the heat sink, a piston member, a resilient member and an embracing member, and the embracing member is movable to grasp the posts by operation of the operating member to cause the piston member to drive the embracing member to move in a first direction away from the printed circuit board and by simultaneous restriction of the heat sink applied to the embracing member in a second direction perpendicular to the first direction when the embracing member moves in the first direction.

15. The assembly of claim 14, wherein the heat sink defines a plurality of openings therein, and the embracing member is movable in a corresponding opening.

16. The assembly of claim 15, wherein the embracing member forms a plurality of embracing arms which are deformable when the embracing member moves in the corresponding opening.

17. The assembly of claim 14, wherein the operating member comprises a static part resting on the heat sink and an active part which has a handle for helping the operation of the operating member.

18. An assembly comprising:

a printed circuit board having a plurality of posts protruding therefrom;

an electronic component mounted on the printed circuit board and disposed among the posts;

a plurality of fasteners; and a heat sink positioned to the electronic component via the fasteners;

wherein each of the fasteners comprises an operating member resting on the heat sink, a piston member, a resilient member and an embracing member; the piston member defines a pair of opposite ends thereof, the operating member and the embracing member are positioned between the opposite ends of the piston member and have the resilient member therebetween, the operating member is lengthenable, so that the embracing member is pulled by the piston member to grasp the posts and the operating member is forced by the piston member toward the heat sink.

19. The assembly of claim 18, wherein the operating member comprises a static part resting on the heat sink and an active part which is movable relative to the static part so that the operating member is lengthened.

* * * * *

UNITED STATES PATENT AND TRADEMARK OFFICE
CERTIFICATE OF CORRECTION

PATENT NO. : 7,180,743 B2 Page 1 of 1
APPLICATION NO. : 10/989694
DATED : February 20, 2007
INVENTOR(S) : Chun-Chi Chen, Shi-Wen Zhou and Hsieh-Kun Lee It is certified that error appears in the above-identified patent and that said Letters Patent is hereby corrected as shown below:

On the cover page replace item (73) Assignee, as follows:

Assignee: Fu Zhun Precision Industry (Shen Zhen) Co., LTD.,

Shenzhen City, Guangdong Province, CHINA

~~Hon Hai Precision Industry Co., Ltd. (TW)~~

Foxconn Technology Co., Ltd., Tu-Cheng City, Taipei Hsien,

TAIWAN

Signed and Sealed this

Twenty-ninth Day of April, 2008

JON W. DUDAS
*Director of the United States Patent and Trademark Office*